US012666598B2

(12) United States Patent
Tang

(10) Patent No.: US 12,666,598 B2
(45) Date of Patent: Jun. 23, 2026

(54) SEMICONDUCTOR STRUCTURE AND FABRICATION METHOD THEREOF

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 778 days.

(21) Appl. No.: 17/945,109

(22) Filed: Sep. 15, 2022

(65) Prior Publication Data

US 2023/0013420 A1 Jan. 19, 2023

(30) Foreign Application Priority Data

Jun. 24, 2022 (CN) .......................... 202210723881.4

(51) Int. Cl.
*H10B 12/00* (2023.01)
*H01L 21/683* (2006.01)
*H01L 25/065* (2023.01)
*H10W 90/00* (2026.01)
*H10W 80/00* (2026.01)

(52) U.S. Cl.
CPC ......... *H10B 12/482* (2023.02); *H10B 12/056* (2023.02); *H10B 12/36* (2023.02); *H10B 12/488* (2023.02); *H10W 90/00* (2026.01); *H10W 80/211* (2026.01); *H10W 80/312* (2026.01); *H10W 80/327* (2026.01); *H10W 90/792* (2026.01)

(58) Field of Classification Search
CPC .. H01L 2924/1436; H01L 2224/08145; H10D 30/63; H10D 30/025; H10B 12/315; H10B 12/31; H10B 12/05; H10B 63/34
See application file for complete search history.

(56) References Cited

U.S. PATENT DOCUMENTS

| | | | | |
|---|---|---|---|---|
| 8,906,775 | B2 * | 12/2014 | Cho | H10B 12/488 |
| | | | | 438/455 |
| 12,170,258 | B2 * | 12/2024 | Yang | H10B 63/34 |
| 2020/0395362 | A1 * | 12/2020 | Park | H10B 12/05 |
| 2022/0139920 | A1 * | 5/2022 | Lee | H10B 12/033 |
| | | | | 438/241 |
| 2023/0371244 | A1 * | 11/2023 | Chen | H10B 12/09 |

FOREIGN PATENT DOCUMENTS

CN          113241347 A          8/2021

* cited by examiner

*Primary Examiner* — Kretelia Graham
*Assistant Examiner* — David J Goodwin
(74) *Attorney, Agent, or Firm* — Intellectual Valley Law, P.C.

(57) ABSTRACT

Embodiments provide a semiconductor structure and a method thereof. The method includes: providing a first substrate, and forming a drive pad on the first substrate; providing a second substrate, and forming active pillars and a bit line in sequence on a side of the second substrate, wherein a side of the bit line is connected to the active pillars, and a surface of the bit line facing away from the active pillars is exposed on a surface of the second substrate; bonding the bit line to the drive pad correspondingly; thinning the second substrate from a side of the second substrate facing away from the first substrate until the active pillars are exposed; and forming a storage capacitor on sides of the active pillars facing away from the drive pad, the storage capacitor being connected to the active pillars.

9 Claims, 9 Drawing Sheets

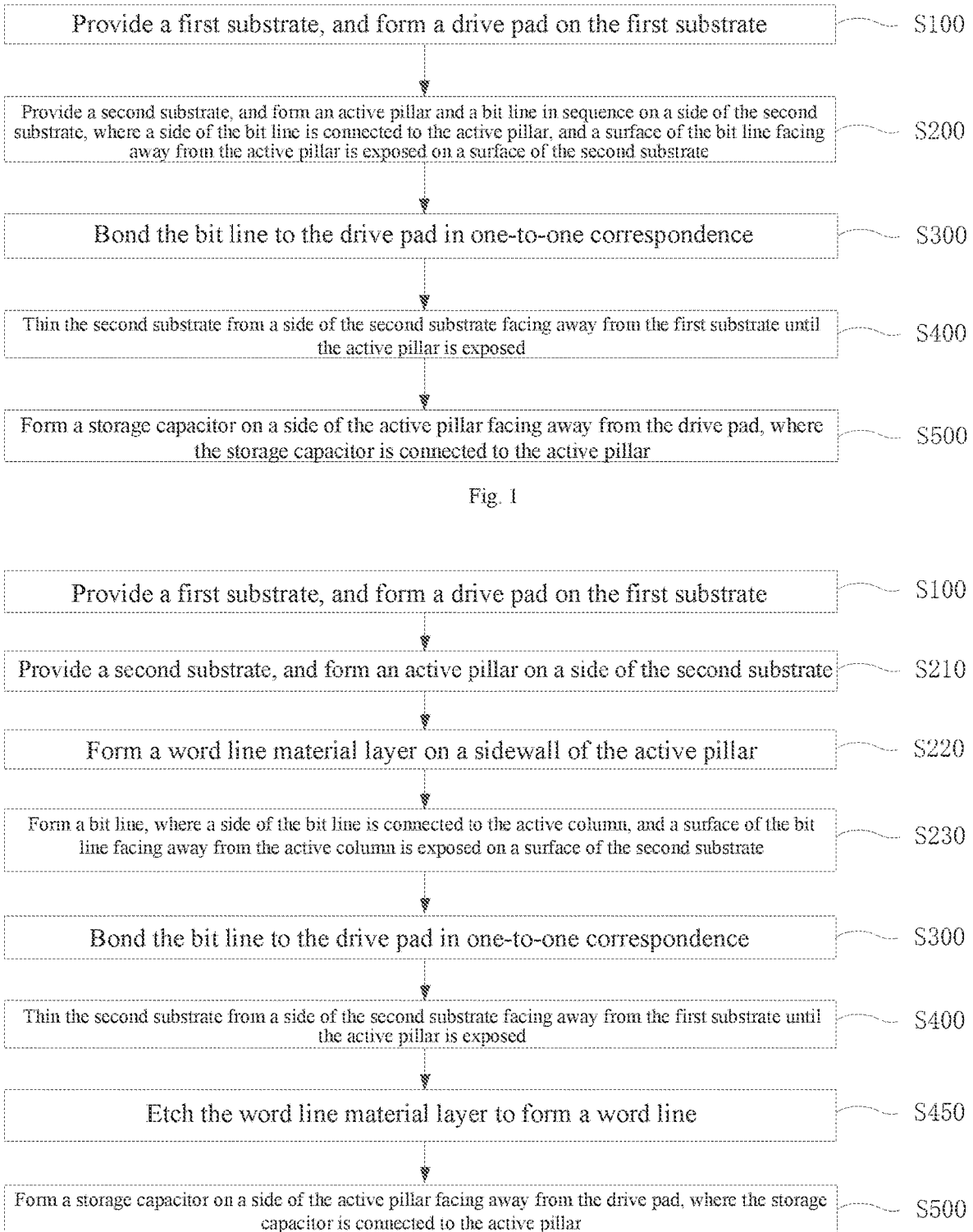

| Provide a first substrate, and form a drive pad on the first substrate | S100 |

| Provide a second substrate, and form an active pillar and a bit line in sequence on a side of the second substrate, where a side of the bit line is connected to the active pillar, and a surface of the bit line facing away from the active pillar is exposed on a surface of the second substrate | S200 |

| Bond the bit line to the drive pad in one-to-one correspondence | S300 |

| Thin the second substrate from a side of the second substrate facing away from the first substrate until the active pillar is exposed | S400 |

| Form a storage capacitor on a side of the active pillar facing away from the drive pad, where the storage capacitor is connected to the active pillar | S500 |

Fig. 1

| Provide a first substrate, and form a drive pad on the first substrate | S100 |

| Provide a second substrate, and form an active pillar on a side of the second substrate | S210 |

| Form a word line material layer on a sidewall of the active pillar | S220 |

| Form a bit line, where a side of the bit line is connected to the active column, and a surface of the bit line facing away from the active column is exposed on a surface of the second substrate | S230 |

| Bond the bit line to the drive pad in one-to-one correspondence | S300 |

| Thin the second substrate from a side of the second substrate facing away from the first substrate until the active pillar is exposed | S400 |

| Etch the word line material layer to form a word line | S450 |

| Form a storage capacitor on a side of the active pillar facing away from the drive pad, where the storage capacitor is connected to the active pillar | S500 |

Fig. 2

Form a storage capacitor on a side of the active pillar facing away from the drive pad, where the storage capacitor is connected to the active pillar — S100

Provide a second substrate, and form an active pillar on a side of the second substrate — S210

Form a sacrificial layer on a surface of the second substrate, the sacrificial layer covers a portion of a side wall of the active pillar and the surface of the second substrate between adjacent two of the active pillars — S215

Form a gate dielectric material layer and a conductive material layer in sequence on an exposed surface of the active pillar, wherein the gate dielectric material layer covers an exposed side wall of the active pillar, the conductive material layer covers the gate dielectric material layer and the sacrificial layer, and the gate dielectric material layer and the conductive material layer jointly constitute the word line material layer — S220

Form an isolation material layer, where the isolation material layer covers the conductive material layer and is filled into a groove between adjacent two of the active pillars — S221

Etch the isolation material layer and the word line material layer in a direction perpendicular to the second substrate, to form an isolation structure and a word line intermediate structure, and expose a portion of the side wall of the active pillar — S222

Form a first dielectric layer, where the first dielectric layer covers the isolation structure, the word line intermediate structure, and a portion of the side wall of the active pillar — S223

Form a second dielectric layer extending in the first direction between adjacent two of the active pillars arranged in the second direction, where the second dielectric layer covers a portion of the first dielectric layer and a portion of the side wall of the active pillar — S224

Form a metal layer on a surface of the groove between adjacent two of the active pillars arranged in the first direction, where the metal layer covers the active pillar and a side wall of the second dielectric layer exposed into the groove — S231

Perform heat treatment on the metal layer and the active pillar covered by the metal layer, to form the bit line connected to the active pillar — S232

Bond the bit line to the drive pad in one-to-one correspondence — S300

Thin the second substrate from a side of the second substrate facing away from the first substrate, until the active pillar and a surface of the sacrificial layer facing away from the word line intermediate structure are exposed — S400

Remove the sacrificial layer and a portion of the word line intermediate structure to form word lines and an isolation portion positioned between adjacent two of the word lines — S450

Form a storage capacitor on a side of the active pillar facing away from the drive pad, where the storage capacitor is connected to the active pillar — S500

Fig. 3

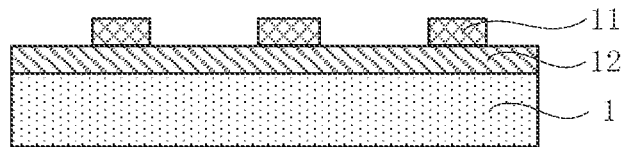
Fig. 4
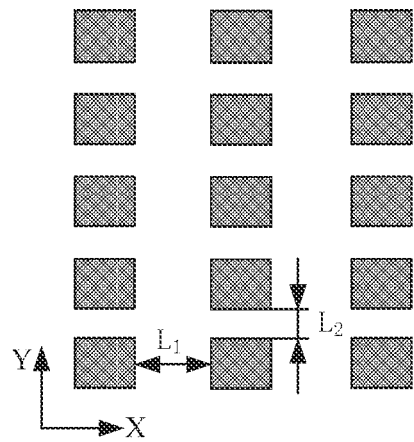
Fig. 5
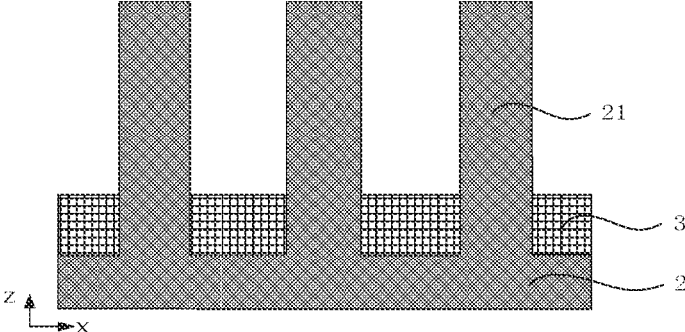
Fig. 6
Fig. 7

SEMICONDUCTOR STRUCTURE AND FABRICATION METHOD THEREOF

CROSS-REFERENCE TO RELATED APPLICATION

This application claims priority to Chinese Patent Application No. 202210723881.4, titled "SEMICONDUCTOR STRUCTURE AND FABRICATION METHOD THEREOF" and filed to the State Patent Intellectual Property Office on Jun. 24, 2022, the entire contents of which are incorporated herein by reference.

TECHNICAL FIELD

The present disclosure relates to the technical field of semiconductors, and more particularly, to a semiconductor structure and a fabrication method thereof.

BACKGROUND

As a semiconductor memory commonly used in an electronic device such as a computer, a dynamic random access memory (DRAM) includes a plurality of memory cells. Each of the plurality of memory cells generally includes a transistor and a capacitor. A gate of the transistor is electrically connected to a word line, a source of the transistor is electrically connected to a bit line, and a drain of the transistor is electrically connected to the capacitor. A word line voltage of the word line can control on or off of the transistor, such that data information stored in the capacitor can be read through the bit line, or the data information can be written into the capacitor.

However, with the development of semiconductor technologies, feature sizes of devices in integrated circuits are getting smaller and smaller. Especially after the semiconductor technologies have entered a deep sub-micron stage, sizes of devices in the DRAM have been reduced to a limit accordingly. On this basis, it has become very difficult to further reduce the sizes of the devices in the DRAM, and further reducing the sizes of the devices will also greatly deteriorate electrical properties of the DRAM.

Therefore, how to further increase a storage density of the semiconductor structure is also a difficult problem to be resolved urgently in the related technologies.

SUMMARY

On this basis, embodiments of the present disclosure provide a semiconductor structure and a fabrication method thereof, which can effectively increase the storage density and simplify a production process, to improve production yield and electrical properties of the semiconductor structure.

In one aspect, some embodiments of the present disclosure provide a method for fabricating a semiconductor structure. The method for fabricating the semiconductor structure includes:

providing a first substrate, and forming a drive pad on the first substrate;

providing a second substrate, and forming a plurality of active pillars and a bit line in sequence on a side of the second substrate, wherein a side of the bit line is connected to the plurality of active pillars, and a surface of the bit line facing away from the plurality of active pillars is exposed on a surface of the second substrate;

bonding the bit line to the drive pad correspondingly;

thinning the second substrate from a side of the second substrate facing away from the first substrate until the plurality of active pillars are exposed; and forming a storage capacitor on sides of the plurality of active pillars facing away from the drive pad, the storage capacitor being connected to the plurality of active pillars.

In another aspect, some embodiments of the present disclosure provide a semiconductor structure obtained by using the method for fabricating the semiconductor structure as described in some of the above embodiments. The semiconductor structure includes: a first substrate, a drive pad being provided on the first substrate; and a memory device bonded to a side of the drive pad facing away from the first substrate. The memory device includes a plurality of active pillars, and a bit line and a storage capacitor respectively positioned at two ends of the plurality of active pillars. A surface of the bit line facing away from the first substrate is connected to ends of the plurality of active pillars close to the first substrate, the storage capacitor is connected to the ends of the plurality of active pillars facing away from the bit line, and a surface of the bit line close to the first substrate is bonded to the drive pad.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

FIG. 1 is a flowchart of a method for fabricating a semiconductor structure according to an embodiment;

FIG. 2 is a flowchart of a method for fabricating the semiconductor structure according to another embodiment;

FIG. 3 is a flowchart of a method for fabricating the semiconductor structure according to yet another embodiment;

FIG. 4 is a schematic structural diagram of a first substrate according to an embodiment;

FIG. 5 is a schematic structural diagram of a structure obtained after forming an active column according to an embodiment;

FIG. 6 is a schematic diagram showing position distribution of active columns according to an embodiment;

FIG. 7 is a schematic structural diagram of a structure obtained after forming a sacrificial layer according to an embodiment;

REFERENCE NUMERALS IN THE ACCOMPANYING DRAWINGS

Figure 8:
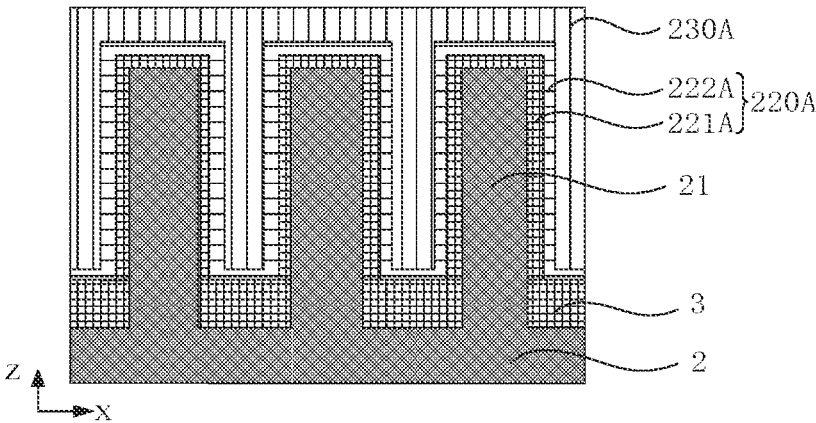
FIG. 8 is a schematic structural diagram of a structure obtained after forming a word line material layer and an isolation material layer according to an embodiment.

1—first substrate, 11—drive pad, 12—circuit layer, 2—second substrate, 21—active pillar, L1—first size, L2—second size, 3—sacrificial layer, 220A—word line material layer, 221A—gate dielectric material layer, 222A—conductive material layer,

230A—isolation material layer, 221B—gate dielectric polishing layer, 222B—conductive material polishing layer, 230B—isolation material polishing layer,

221C—gate dielectric intermediate structure, 222C—conductive material intermediate structure, 221—gate dielectric layer, 222—conductive layer,

22—word line intermediate structure, 23A—isolation structure, 23—isolation portion, 24—first dielectric layer, 25—second dielectric layer,

26—third dielectric layer, 27—fourth dielectric layer, G—groove, M—metal layer, BL—bit line, WL—word line, C—storage capacitor,

B—thickness of a word line in a first direction, T—thickness of a conductive layer in a first direction, N—memory device.

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present.

It should be understood that although the terms first, second, etc. may be employed to describe various elements, components, regions, layers, doping types and/or sections, these elements, components, regions, layers, doping types and/or sections should not be limited by these terms. These terms are only employed to distinguish one element, component, region, layer, doping type, or section from another element, component, region, layer, doping type, or section. Therefore, without departing from the teachings of the present disclosure, a first element, component, region, layer, doping type, or section discussed below may be represented as a second element, component, region, layer, doping type, or section.

Spatially relative terms such as "below", "under", "lower", "beneath", "above", "upper" and the like may be used herein to describe relationships between one element or feature as shown in the figures and another element(s) or feature(s). It should be understood that the spatially relative terms may be intended to encompass different orientations of a device in use or operation in addition to the orientation depicted in the figures. For example, if the device in the figures is turned over, elements or features described as "under", "beneath" or "below" other elements would then be oriented "above" the other elements or features. Thus, the example term "under", "below" or "beneath" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should be also understood that the terms "comprise/include" or "having" and so on refer to the presence of stated features, integers, steps, operations, components, parts or combinations thereof, but do not preclude possibility of the presence or addition of one or more other features, integers, steps, operations, components, parts or combinations thereof. Meanwhile, the term "and/or" used in the specification includes any and all combinations of related listed items.

Embodiments of the present disclosure are described herein with reference to cross-sectional illustrations serving as schematic illustrations of idealized embodiments (and intermediate structures) of the present disclosure. As such, variations from the shapes of the illustrations as a result, for example, of manufacturing techniques and/or tolerances, may be expected. Thus, the embodiments of the present disclosure should not be construed as being limited to particular shapes of regions illustrated herein but may include deviations in shapes that result, for example, from the manufacturing techniques. Thus, regions illustrated in the figures are schematic in nature and their shapes do not necessarily illustrate the actual shape of a region of the device and do not limit the scope of the present disclosure.

At present, with the development of semiconductor technologies, the feature sizes of the devices in the integrated circuits are getting smaller and smaller. Especially after the semiconductor technologies have entered the deep sub-micron stage, the sizes of the devices in the DRAM have been reduced to the limit accordingly. For example, the DRAM can implement arrangement of memory cells with a limit plane area size of $6F^2$ and a fabrication method using a buried word line, where F represents a minimum process size, which refers to the minimum size processable, also known as a key size, and can be used as a standard to define level of fabrication processes. On this basis, it has become very difficult to further reduce the sizes of the devices in the DRAM, and further reducing the sizes of the devices will also greatly deteriorate the electrical properties of the DRAM.

In some examples, new materials may be employed to fabricate the DRAM to improve the electrical properties of the DRAM, but this requires higher production costs and more complex fabrication processes.

the embodiments of the present disclosure provide a semiconductor structure and a fabrication method thereof, which can effectively increase the storage density, for example, arrangement of memory cells with a limit plane area size of $4F^2$ can be implemented, and can simplify production processes, to improve production yield and electrical properties of the semiconductor structure.

Referring to FIG. 1, some embodiments of the present disclosure provide a method for fabricating a semiconductor structure. The method for fabricating the semiconductor structure includes following steps.

S100: providing a first substrate, and forming a drive pad on the first substrate;

S200: providing a second substrate, and forming an active pillar and a bit line in sequence on a side of the second substrate, wherein a side of the bit line is connected to the active pillar, and a surface of the bit line facing away from the active pillar is exposed on a surface of the second substrate;

S300: bonding the bit line to the drive pad correspondingly;

S400: thinning the second substrate from a side of the second substrate facing away from the first substrate until the active pillar is exposed; and S500: forming a storage capacitor on a side of the active pillar facing away from the drive pad, the storage capacitor being connected to the active pillar.

In the embodiments of the present disclosure, a drive pad may be formed first by means of a first substrate, a plurality of active pillars and a bit line are formed by means of a second substrate, and the first substrate supports a device on the second substrate by bonding the drive pad on the first substrate to the bit line correspondingly. Next, the second substrate is thinned to expose the ends of the plurality of active pillars facing away from the first substrate, and the storage capacitor connected to the plurality of active pillars correspondingly can be formed on sides of the plurality of active pillars facing away from the first substrate. In this way, the method provided by the embodiments of the present disclosure has a simple process, and can form the vertical transistor based on the active column, fabricate the bit line on one side of the second substrate, and fabricate the storage capacitor on the other side of the second substrate. In this way, not only fabrication processes can be greatly simplified for a semiconductor structure to increase the production yield, but also the size of the vertical transistor and the size of the storage capacitor in the horizontal direction can be reduced to a greater extent, to further increase the storage density and effectively ensure the electrical properties of the device structures in the semiconductor structure.

In addition, according to the embodiments of the present disclosure, the semiconductor structure is fabricated by bonding the drive pad on the first substrate to the bit line on the second substrate correspondingly, which is also beneficial to reduce a plane area of the semiconductor structure, thereby increasing number of storage capacitors in a unit area, and increasing area utilization of a wafer.

In some embodiments, it is to be understood that in Step S200, the plurality of active pillars and the bit line are sequentially formed on a side of the second substrate. That is, the plurality of active pillars and the bit line are formed separately. In this way, after the plurality of active pillars are formed and before the bit line is formed, the method further includes: forming a word line material layer on the side walls of the plurality of active pillars.

For example, referring to FIG. 2, Step S200 may include the following steps.

S210: providing a second substrate, and forming a given active pillar on a side of the second substrate.

S220: forming a word line material layer on the side walls of the plurality of active pillars.

S230: forming a bit line, a side of the bit line being connected to the given active column, and a surface of the bit line facing away from the given active column being exposed on a surface of the second substrate.

Correspondingly, with continued reference to FIG. 2, after Step S400 is performed to thin the second substrate until the plurality of active pillars are exposed and before Step S500 is performed to form the storage capacitor on the sides of the plurality of active pillars away from the drive pad, the method also includes:

S450: etching the word line material layer to form a word line.

For example, the bit line extends in a first direction, and the word line extends in a second direction. The first direction intersects with, e.g., is perpendicular to, the second direction.

In some embodiments, the forming the active pillar on a side of the second substrate in Step S210 includes: patterning the second substrate to form a plurality of active pillars arranged in an array.

Here, the plurality of active pillars are arranged in an array, and are arranged in rows in the first direction and arranged in columns in the second direction. In some embodiments, an interval between some of the plurality of active pillars arranged in rows in the first direction may be different from an interval between some of the plurality of active pillars arranged in columns in the second direction.

For example, a distance between adjacent two of the plurality of active pillars in the first direction is a first size, and a distance between adjacent two of the plurality of active pillars in the second direction is a second size. The first size is three times greater than the second size, and the second size is less than or equal to two or three times a thickness of the word line in the first direction.

In a further example, the word line includes a gate dielectric layer and a conductive layer provided on the side wall of the active pillar in a direction distant from the active pillar, wherein the second size is less than or equal to three times the thickness of the conductive layer in the first direction.

In some embodiments, referring to FIG. 3, before Step S220 is performed to form the word line material layer on the side walls of the plurality of active pillars, the method further includes:

S215: forming a sacrificial layer on a surface of the second substrate, the sacrificial layer covering a portion of the side walls of the plurality of active pillars and the surface of the second substrate between adjacent two of the plurality of active pillars.

Correspondingly, the forming a word line material layer on the side walls of the plurality of active pillars in Step S220 includes: forming a gate dielectric material layer and a conductive material layer in sequence on exposed surfaces of the plurality of active pillars, wherein the gate dielectric material layer covers the exposed side walls of the plurality of active pillars, and the conductive material layer covers the gate dielectric material layer and the sacrificial layer. In this way, the gate dielectric material layer and the conductive material layer may jointly constitute the word line material layer.

Correspondingly, after Step S220 is performed to form the word line material layer on the side wallside walls of the plurality of active pillars, the method further includes:

S221: forming an isolation material layer, the isolation material layer covering the conductive material layer and being filled into a groove between adjacent two of the plurality of active pillars.

On this basis, with continued reference to FIG. 3, in some embodiments, before Step S230 is performed to form the bit line, the method further includes the following steps.

S222: etching the isolation material layer and the word line material layer in a direction perpendicular to the second substrate, to form an isolation structure and a word line intermediate structure, and expose a portion of the side walls of the plurality of active pillars;

S223: forming a first dielectric layer, the first dielectric layer covering the isolation structure, the word line intermediate structure, and a portion of the side walls of the plurality of active pillars; and S224: forming a second dielectric layer extending in the first direction between adjacent two of the plurality of active pillars arranged in the second direction, the second dielectric layer covering a portion of the first dielectric layer and a portion of the side walls of the plurality of active pillars.

Correspondingly, in some embodiments, with continued reference to FIG. 3, the forming a bit line in Step S230 includes the following steps.

S231: forming a metal layer on a surface of the groove between adjacent two of the plurality of active pillars arranged in the first direction, the metal layer covering the plurality of active pillars and a side wall of the second dielectric layer exposed into the groove; and S232: performing heat treatment on the metal layer and the plurality of active pillars covered by the metal layer, to form the bit line connected to the plurality of active pillars.

In some embodiments, after a metal layer and the plurality of active pillars covered by the metal layer are subjected to the heat treatment, a portion of the plurality of active pillars covered by the metal layer may form a metal silicide. Next, the residual metal layer may be removed by cleaning, such that the metal layer is deposited into the groove for a second time to form the bit line. In this way, the bit line may be jointly constituted by the metal layer and the metal silicide at the bottoms of the plurality of active pillars. In addition, in the embodiments of the present disclosure, after the metal silicide is formed, the bit line is formed by removing the residual metal layer and depositing the metal layer again, which not only can avoid the problem of short circuit between different rows of metal layers caused by the heat treatment, but also can effectively reduce a contact resistance between the metal layer and the plurality of active pillars by means of the metal silicide, thereby improving the electrical properties of the semiconductor structure.

In some embodiments, with continued reference to FIG. 3, the thinning the second substrate from a side of the second substrate facing away from the first substrate until the plurality of active pillars are exposed in Step S400 further includes: exposing a surface of the sacrificial layer facing away from the word line intermediate structure.

Correspondingly, Step S450 may be manifested as: removing the sacrificial layer and a portion of the word line intermediate structure to form the word line and an isolation portion positioned between adjacent two of the word lines.

On this basis, in some embodiments, the removing the word line intermediate structure includes: forming an etching opening on the sacrificial layer, and etching the word line intermediate structure in a direction perpendicular to the first substrate according to the etching opening, to separate the conductive material layer between adjacent two of the plurality of active pillars in the first direction, and enable the conductive material layer connected in the second direction to constitute the word line.

It is worth mentioning that the word line extends in the second direction. In the above example where the first size is three times greater than the second size, and the second size is less than or equal to two or three times the thickness of the word line in the first direction, or the second size is less than or equal to three times the thickness of the conductive layer in the first direction, when a conductive material layer is deposited between adjacent two of the plurality of active pillars arranged in the second direction, the conductive material layers positioned on side walls of the adjacent two of the plurality of active pillars may be connected directly. That is, after the conductive material layer is deposited, there is no groove space anymore between adjacent two of the plurality of active pillars in the second direction for depositing the isolation material layer. On this basis, after the second substrate is thinned, a portion of the word line intermediate structure is removed by etching in a direction perpendicular to the first substrate, such that word lines and an isolation portion between adjacent two of the word lines can be obtained, thereby ensuring that adjacent two of the word lines are not connected to each other. Therefore, it is advantageous to use a wet etching process for etching, to simplify the method for fabricating the semiconductor structure.

In addition, in some other examples, an isolation structure is also formed in the interval between adjacent two of the plurality of active pillars in the second direction. In this way, the word line intermediate structure may also be removed by means of following steps.

A mask layer is formed on the sacrificial layer and the surfaces of the plurality of active pillars, where the mask layer covers the surfaces of the plurality of active pillars and extends along the second direction to expose the sacrificial layer positioned between adjacent two of the plurality of active pillars in the first direction.

The exposed sacrificial layer is etched to expose the word line intermediate structure positioned between adjacent two of the plurality of active pillars in the first direction.

The exposed word line intermediate structure is etched to expose the isolation structures to separate the conductive material layer between adjacent two of the plurality of active pillars in the first direction.

The mask layer and the residual sacrificial layer are removed, such that the residual word line intermediate structure on the side walls of the plurality of active pillars forms the word line, and the residual isolation structure forms the isolation portion.

In some embodiments, after the word line is formed in Step S450 and before the storage capacitor is formed on the sides of the plurality of active pillars facing away from the drive pad in Step S500, the method further includes: forming a third dielectric layer, the third dielectric layer covering the word line and a portion of the side walls of the plurality of active pillars; and forming a fourth dielectric layer, the fourth dielectric layer covering the third dielectric layer and residual side walls of the plurality of active pillars, and a surface of the fourth dielectric layer facing away from the first substrate being flush with the surfaces of the plurality of active pillars facing away from the first substrate.

In some embodiments, the Step S500 of forming the storage capacitor on sides of the plurality of active pillars facing away from the drive pad further includes: polishing the plurality of active pillars and the surface of the fourth dielectric layer facing away from the first substrate; and forming the storage capacitor on the surfaces of the plurality of active pillars.

To more clearly illustrate the method for fabricating the semiconductor structure provided by the embodiments of the present disclosure, the method provided by the embodiments of the present disclosure is described in detail below with reference to FIG. 4 to FIG. 21.

In Step S100, referring to FIG. 4, a first substrate 1 is provided, and a drive pad 11 is formed on the first substrate 1.

Here, the first substrate 1 may be made of a semiconductor material, an insulating material, a conductor material, or any combination thereof. The first substrate 1 may be of a single-layer structure or a multi-layer structure. For example, the first substrate 1 may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an indium arsenide (InAs) substrate, an indium phosphide (InP) substrate, or another III/V semiconductor substrate or II/VI semiconductor substrate. In some embodiments, for another example, the first substrate 1 may be a layered substrate including, for example, Si/SiGe, Si/SiC, silicon-on-insulator (SOI), or silicon-germanium-on-insulator.

In addition, with continued reference to FIG. 4, a circuit layer 12 may be provided on the first substrate 1, where the circuit layer 12 includes a drive circuit (not shown in FIG. 4) connected to the drive pad 11 correspondingly. The drive pad 11 may be made of metal, such as tungsten or copper. Each drive circuit in the circuit layer 12 may be formed by a complementary metal oxide semiconductor (CMOS) device.

In Step S200, referring to FIG. 5 to FIG. 14, a second substrate 2 is provided, and an active pillar 21 and a bit line BL are sequentially formed on a side of the second substrate 2.

Here, the second substrate 2 may be made of a semiconductor material, an insulating material, a conductor material, or any combination thereof. The second substrate 2 may be of a single-layer structure or a multi-layer structure. For example, the second substrate 2 may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an indium arsenide (InAs) substrate, an indium phosphide (InP) substrate, or another III/V semiconductor substrate or II/VI semiconductor substrate. In some embodiments, for another example, the second substrate 2 may be a layered substrate including, for example, Si/SiGe, Si/SiC, silicon-on-insulator (SOI), or silicon-germanium-on-insulator.

For example, Step S200 may include the following steps S210 to S230.

In Step S210, as shown in FIG. 5, the active pillar 21 is formed on a side of the second substrate 2.

Here, the active pillar 21 may be formed by patterning the second substrate 2. That is, a plurality of mask patterns arranged in a matrix are formed on the surface of the second substrate 2, and the active pillar 21 is formed by etching the second substrate 2 not covered by the plurality of mask patterns. In addition, the plurality of active pillars 21 are arranged in an array. For example, the plurality of active pillars 21 may be arranged in columns at equal intervals in the first direction, and arranged in rows at equal intervals in the second direction.

For example, referring to FIG. 6, a size of the distance between adjacent two of the plurality of active pillars 21 in the first direction (e.g., an X direction) is a first size $L_1$, and a size of the distance between adjacent two of the plurality of active pillars 21 in the second direction (e.g., a Y direction) is a second size $L_2$. The first size $L_1$ is three times greater than the second size $L_2$. That is, $L_1 > 3L_2$. In addition, the second size L2 may be less than or equal to two or three times a thickness B of the subsequently formed word line in the first direction. That is, $L_2 < 2B$ or $L_2 > 3B$.

In Step S215, as shown in FIG. 7, a sacrificial layer 3 is formed on the surface of the second substrate 2, and the sacrificial layer 3 covers a portion of the side wall of the active pillar 21 and the surface of the second substrate 2 between two adjacent of the plurality of active pillars 21.

Here, the sacrificial layer 3 may be formed by means of a deposition process, and a deposition thickness of the sacrificial layer 3 may be selected and set according to requirements. For example, the deposition thickness is less than or equal to one third of a height of the active pillar 21. In some embodiments, the sacrificial layer 3 may also be deposited first and then etched back to obtain a predetermined thickness.

For example, the sacrificial layer 3 is formed by an oxide, such as silicon oxide.

In Step S220, referring to FIG. 8, a word line material layer 220A is formed on a side wall of the active pillar 21.

For example, the word line material layer 220A includes a gate dielectric material layer 221A and a conductive material layer 222A that are stacked. The gate dielectric material layer 221A covers the exposed side wall of the active pillar 21, the conductive material layer 222A covers the gate dielectric material layer 221A and the sacrificial layer 3, and the gate dielectric material layer 221A and the conductive material layer 222A jointly constitute the word line material layer 220A.

Here, the gate dielectric material layer 221A may be formed by means of a deposition process, or may be directly formed by oxidizing the surface of the active pillar 21.

For example, the gate dielectric material layer 221A may be formed by means of deposition of a high-K dielectric material, such as silicon oxide ($SiO_2$), silicon nitride (SiN), silicon oxynitride (SiON), or aluminum silicate (HfSiO).

For example, the conductive material layer 222A may include a metal or metal compound, such as titanium (Ti), titanium nitride (TiN), tungsten (W), cobalt (Co), copper (Cu), or aluminum (Al). The conductive material layer 222A may be formed by means of a deposition process, such as physical vapor deposition (PVD), atomic layer deposition (ALD), plasma enhanced chemical vapor deposition (PECVD).

For example, the gate dielectric material layer 221A and the sacrificial layer 3 may be made of the same material such as silicon oxide. As such, the gate dielectric material layer 221A and the sacrificial layer 3 may be formed by means of the same deposition process.

In Step S221, with continued reference to FIG. 8, an isolation material layer 230A is formed, where the isolation material layer 230A covers the conductive material layer 222A and is filled into a groove between adjacent two of the plurality of active pillars 21.

For example, the isolation material layer 230A may be formed by means of a nitride such as silicon nitride.

It is to be understood that, in the example where the second size L2 between adjacent two of the plurality of active pillars 21 in the second direction may be less than or equal to two or three times the thickness B of the word line in the first direction, after the gate dielectric material layer 221A and the conductive material layer 222A are formed, the groove between adjacent two of the plurality of active pillars 21 in the second direction may be filled up with the gate dielectric material layer 221A and the conductive material layer 222A. In this way, the isolation material layer 230A may not be formed between adjacent two of the plurality of active pillars 21 in the second direction.

Figure 9:
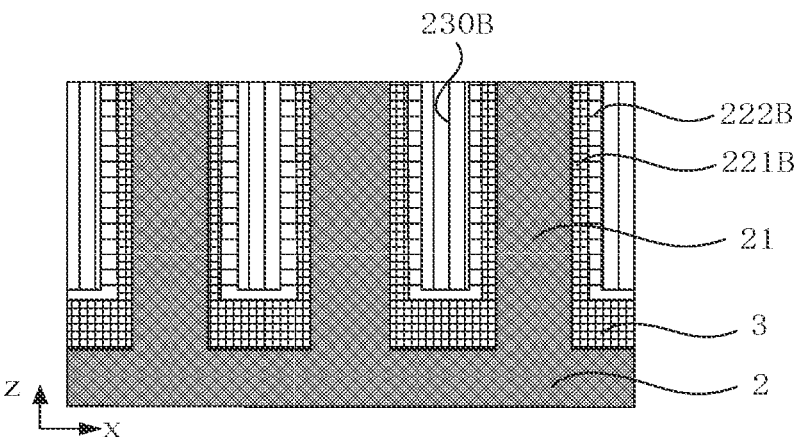
FIG. 9 is a schematic structural diagram of a structure obtained by removing part of the word line material layer and part of the isolation material layer according to an embodiment.
Figure 10:
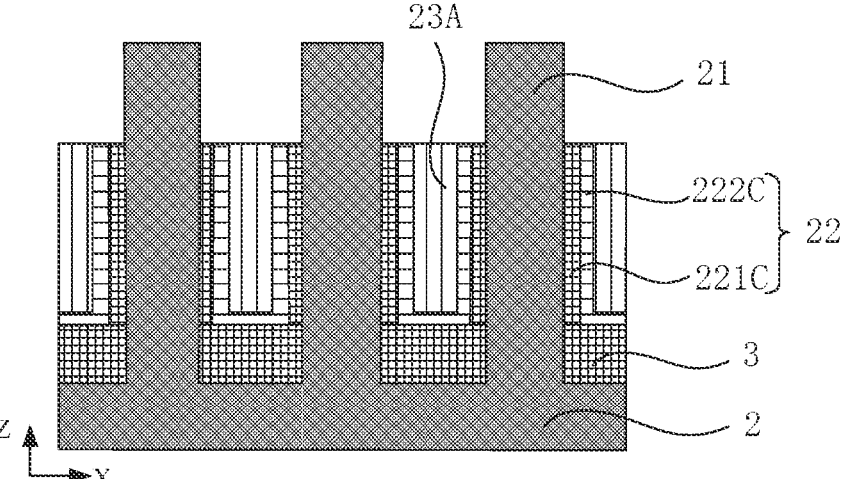
FIG. 10 is a schematic structural diagram of a structure obtained after forming a word line intermediate structure and an isolation structure according to an embodiment.

In Step S222, referring to FIG. 8, FIG. 9, and FIG. 10, the isolation material layer 230A and the word line material layer 220A are etched in a direction perpendicular to the second substrate 2, to form an isolation structure 23 and a word line intermediate structure 22, and expose a portion of the side wall of the active pillar 21.

For example, as shown in FIG. 9, after the isolation material layer 230A is formed, a portion of the isolation material layer 230A and a portion of the word line material layer 220A may be removed first by means of a chemical mechanical polishing (CMP) process until the active pillar 21 is exposed, to form an isolation material polishing layer 230B, a conductive material polishing layer 222B, and a gate dielectric material polishing layer 221B. Next, as shown in FIG. 10, the isolation material polishing layer 230B, the conductive material polishing layer 222B and the gate dielectric material polishing layer 221B may be further etched by means of dry etching or wet etching, to correspondingly form the isolation structure 23A and the word line intermediate structure 22. The word line intermediate structure 22 includes a gate dielectric intermediate structure 221C and a conductive material intermediate structure 222C.

Figure 11:
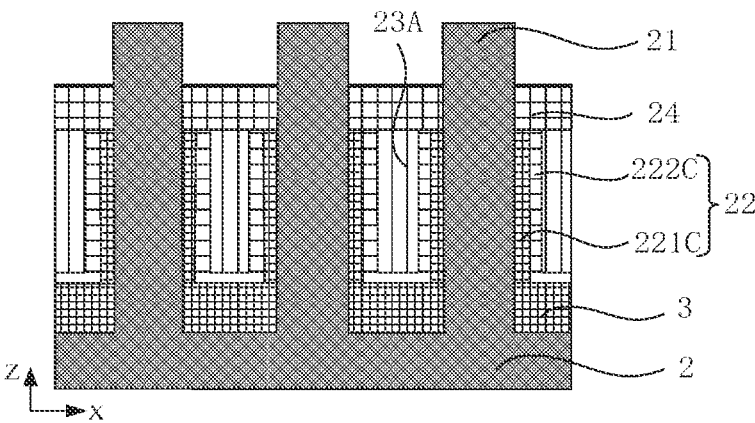
FIG. 11 is a schematic structural diagram of a structure obtained after forming a first dielectric layer according to an embodiment.

In Step S223, referring to FIG. 11, a first dielectric layer 24 is formed. The first dielectric layer 24 covers the isolation structure 23A, the word line intermediate structure 22, and a portion of the side wall of the active pillar 21.

For example, the first dielectric layer 24 may be made of a nitride such as silicon nitride.

Figure 12:
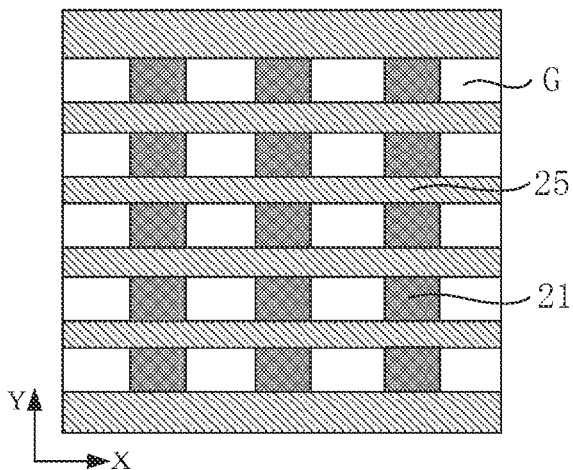
FIG. 12 is a schematic structural diagram of a structure obtained after forming a second dielectric layer according to an embodiment.

In Step S224, referring to FIG. 12, a second dielectric layer 25 extending in the first direction (e.g., the X direction) is formed between adjacent two of the plurality of active pillars 21 arranged in the second direction (e.g., the Y direction). The dielectric layer 25 covers the first dielectric layer 24 extending in the first direction (e.g., the X direction)

and a portion of the side wall of the active pillar 21. In this way, there may be a groove G between adjacent two of the plurality of active pillars 21 arranged in the first direction (e.g., the X direction).

For example, the second dielectric layer 25 may be made of an oxide such as silicon oxide.

In some embodiments, the second dielectric layer 25 may be formed by patterning the second dielectric material layer and removing the second dielectric material layer unmasked after the second dielectric material layer is deposited. In some embodiments, the second dielectric layer 25 may also be formed by arranging a mask pattern in the groove G and depositing directly on the first dielectric layer 24 not covered by the mask pattern, and then the mask pattern is removed.

Figure 13:
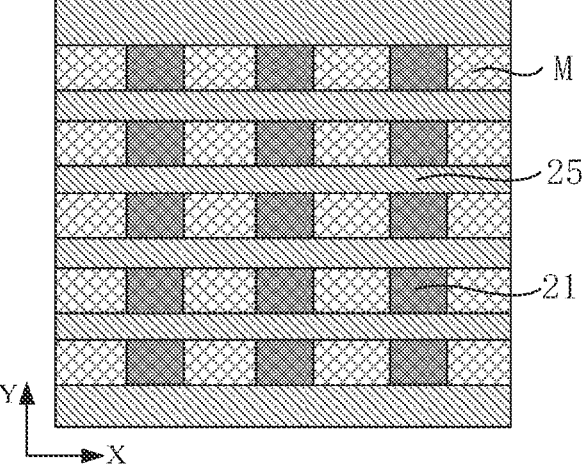
FIG. 13 is a schematic top view of a structure obtained after forming a bit line according to an embodiment.
Figure 14:
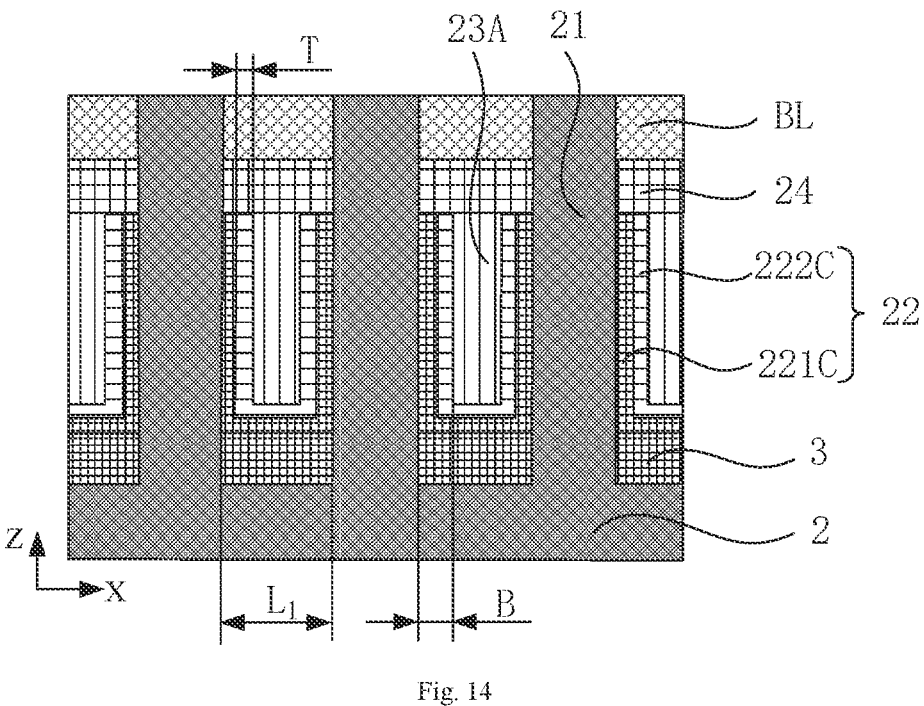
FIG. 14 is a schematic structural diagram of a structure obtained after forming a bit line according to an embodiment.

In Step S230, referring to FIG. 13 and FIG. 14, a bit line BL is formed. A side of the bit line BL is connected to the active pillar 21, and a surface of the bit line BL facing away from the active pillar 21 is exposed on the surface of the second substrate 2.

For example, Step S230 may include following Steps S231 to S233.

In Step S231, referring to FIG. 13, a metal layer M is formed on the surface of the groove G between adjacent two of the plurality of active pillars 21 in the first direction (e.g., the X direction), and the metal layer M covers the active pillar 21 and a side wall of the second dielectric layer 24 exposed into the groove G.

In Step S232, referring to FIG. 13 and FIG. 14, the metal layer M and the active pillar 21 covered by the metal layer M are subjected to heat treatment to form the bit line BL connected to the active pillar 21.

In some embodiments, after the heat treatment is performed on the metal layer M and the active pillar 21 covered by the metal layer M, a metal silicide may be formed on the surface of the active pillar 21. Next, the residual metal layer may be removed by cleaning, to deposit the metal layer in the groove G for the second time to form the bit line BL. In this way, the bit line may be jointly constituted by the metal layer and the metal silicide. In addition, in the embodiments of the present disclosure, after the metal silicide is formed, the bit line BL is formed by removing the residual metal layer and depositing the metal layer again, which not only can avoid the problem of short circuit between different rows of metal layers caused by the heat treatment, but also can effectively reduce a contact resistance between the metal layer and the plurality of active pillars by means of the metal silicide, thereby improving the electrical properties of the semiconductor structure.

In some embodiments, the metal layer M may be made of a metal material such as tungsten (W), cobalt (Co), or aluminum (Al).

Figure 15:
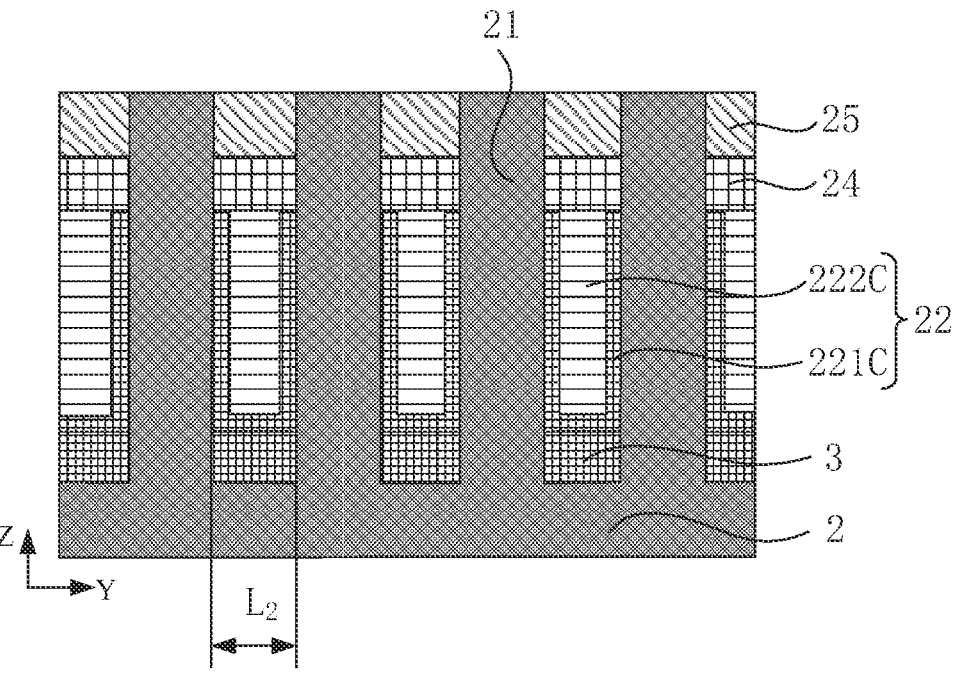
FIG. 15 is a schematic structural diagram of a word line intermediate structure in a second direction according to an embodiment.

It should be supplemented that, with continued reference to FIG. 14 and FIG. 15, in some examples, the second size L2 configured for representing the distance between adjacent two of the plurality of active pillars 21 in the second direction (e.g., the Y direction) is, for example, less than or equal to two times the thickness (i.e., the width B of the word line intermediate structure 22 in the first direction at this moment) of the word line material layer 220A in the first direction; or, the second size L2 is less than or equal to three times the thickness T of the conductive material intermediate structure 222C in the first direction. In this way, after the gate dielectric intermediate structure 221C and the conductive material intermediate structure 222C are formed, the groove between adjacent two of the plurality of active pillars 21 in the second direction may be filled up with the gate dielectric intermediate structure 221C and the conductive material intermediate structure 222C. In this way, the isolation structure 23A may not be formed between adjacent two of the plurality of active pillars 21 in the second direction (e.g., the Y direction), for example, as shown in FIG. 15.

Figure 16:
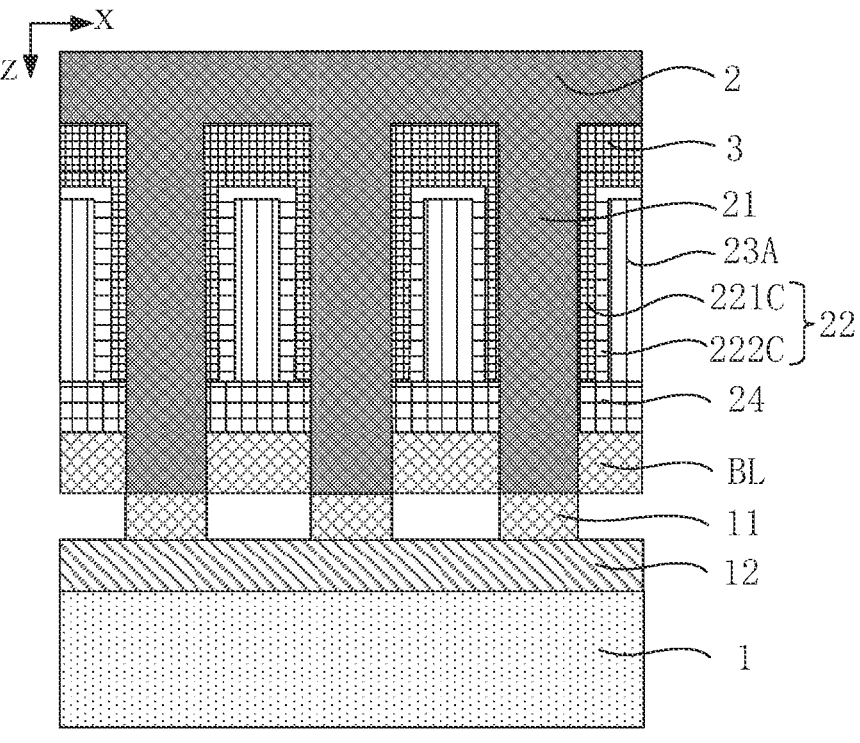
FIG. 16 is a schematic structural diagram of a structure obtained by bonding a bit line to a drive pad according to an embodiment.

In Step S300, referring to FIG. 16, the bit line BL is bonded to the drive pad 11 correspondingly.

Here, it is to be understood that by aligning and snapping a side of the second substrate 2 on which the bit line BL is formed towards a side of the first substrate 1 on which the drive pad 11 is formed, the bit line BL may be aligned and bonded to the drive pad 11. In the embodiments of the present disclosure, number and position of the drive pads 11 bonded to the same bit line BL are not limited. A bonding as shown in FIG. 16 is only employed to express a bonding relationship between the bit line BL and the drive pad 11, but not to impose a limitation on the bonding position between the bit line BL and the drive pad 11.

Figure 17:
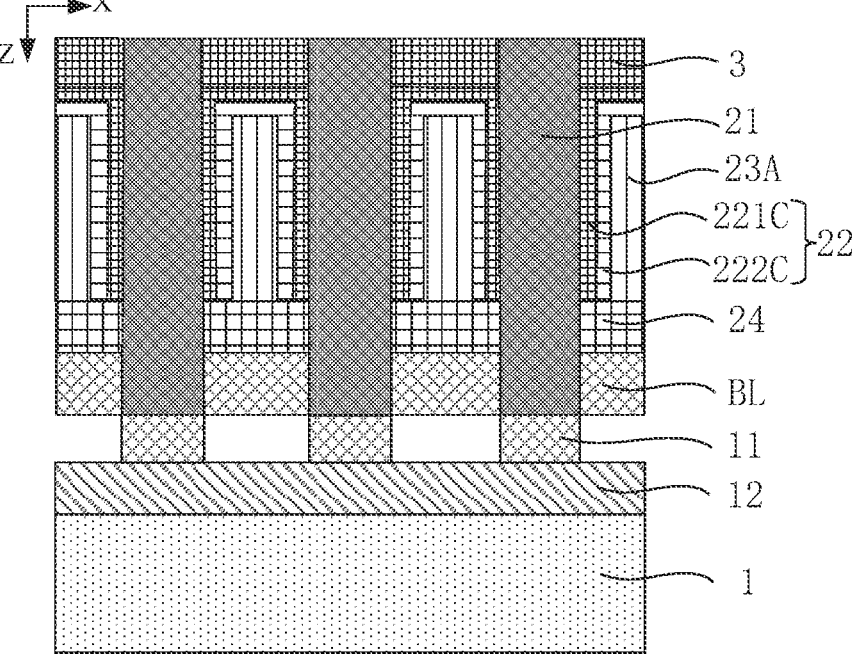
FIG. 17 is a schematic structural diagram of a structure obtained after thinning the second substrate to expose an active pillar according to an embodiment.

In Step S400, referring to FIG. 16 and FIG. 17, the second substrate 2 is thinned from a side of the second substrate 2 facing away from the first substrate 1 until the active pillar 21 is exposed.

In some embodiments, the surface of the second substrate 2 facing away from the first substrate 1 may be polished by means of the chemical mechanical polishing (CMP) process, until the surface of the sacrificial layer 3 facing away from the word line intermediate structure 22 is exposed, for example, as shown in FIG. 17. The sacrificial layer 3 may serve as a polishing barrier layer for thinning the second substrate 2.

Figure 18:
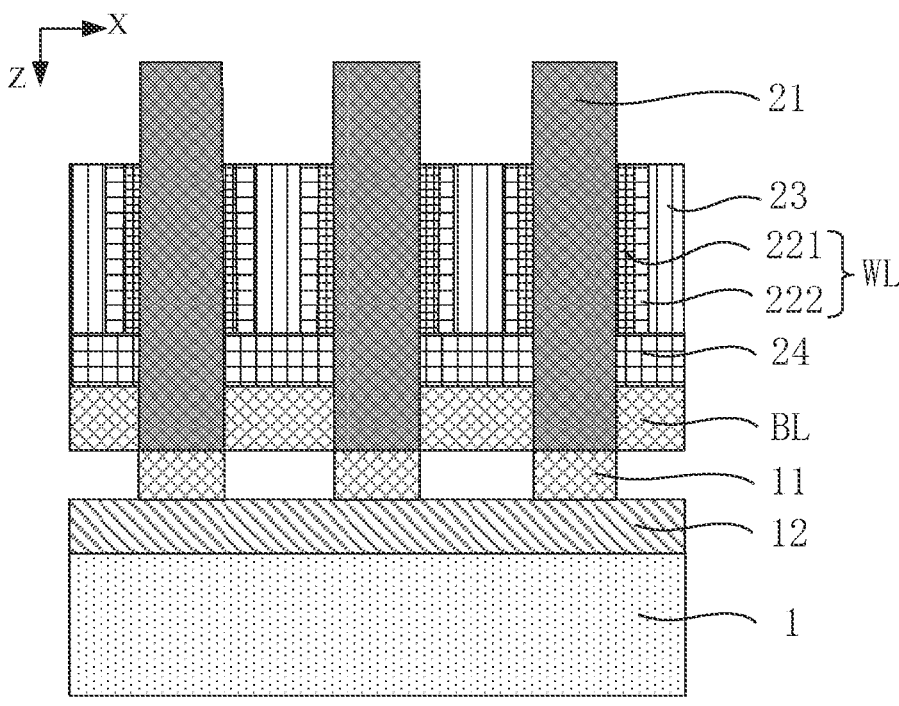
FIG. 18 is a schematic structural diagram of a structure obtained after forming a word line and an isolation portion according to an embodiment.

In Step S450, referring to FIG. 17 and FIG. 18, the sacrificial layer 3 and a portion of the word line intermediate structure 22 are removed to form word lines WL and an isolation portion 23 positioned between adjacent two of the word lines WL.

In some examples, the sacrificial layer 3 and a portion of the word line intermediate structure 22 may be removed by means of a wet etching process or a dry etching process.

In some embodiments, the removed portion of the word line intermediate structure 22 is the word line intermediate structure 22 positioned between the sacrificial layer 3 and the isolation structure 23A in the first direction (e.g., the X direction). The removing a portion of the word line intermediate structures 22 includes: etching the word line intermediate structure 22 in a direction (e.g., a Z direction) perpendicular to the first substrate 1, to separate the conductive material layer (i.e., a portion of the conductive material intermediate structure 222C) between adjacent two of the plurality of active pillars 21 in the first direction (e.g., the X direction), and enable the conductive material layer (i.e., the conductive material 222 formed after patterning the conductive material intermediate structure 222C) connected in the second direction (e.g., the Y direction) to constitute the word line WL.

Here, the word line WL also includes a gate dielectric layer 221 formed after patterning the gate dielectric intermediate structure 221C.

In addition, in some examples, an isolation structure 23A is also formed in an interval between adjacent two of the plurality of active pillars 21 in the second direction (e.g., the Y direction). Thus, the removal of the word line intermediate structure 22 may also be achieved by means of the following steps.

A mask layer (not shown in FIG. 17) is formed on the surface of the sacrificial layer 3 and the surface of the active pillar 21, and the mask layer extends in the second direction (e.g., the Y direction) to expose the sacrificial layer 3 positioned between adjacent two of the plurality of active pillars 21 in the first direction (e.g., the X direction).

The exposed sacrificial layer 3 is etched to expose the word line intermediate structure 22 positioned between adjacent two of the plurality of active pillars 21 in the first direction (e.g., the X direction).

The exposed word line intermediate structure 22 is etched to expose the isolation structures 23A, to separate the conductive material layer (i.e., a portion of the conductive material intermediate structures 222C) between adjacent two of the plurality of active pillars 21 in the first direction (e.g., the X direction).

To ensure that the conductive material layer between adjacent two of the plurality of active pillars 21 in the first direction (e.g., the X direction) is completely separated, after the word line intermediate structure 22 in contact with the isolation structure 23A is etched, a portion of the isolation structure 23A and a portion of the word line intermediate structure 22 on the side wall of the active pillar 21 may also be continuously etched downwards, to completely remove the word line intermediate structure 22 positioned between the sacrificial layer 3 and the isolation structure 23A in the first direction (e.g., the X direction).

The mask layer and the residual sacrificial layer 3 are removed, such that the residual word line intermediate structure on the side wall of the active pillar 21 forms the word line WL, and the residual isolation structure forms the isolation portion 23.

Figure 19:
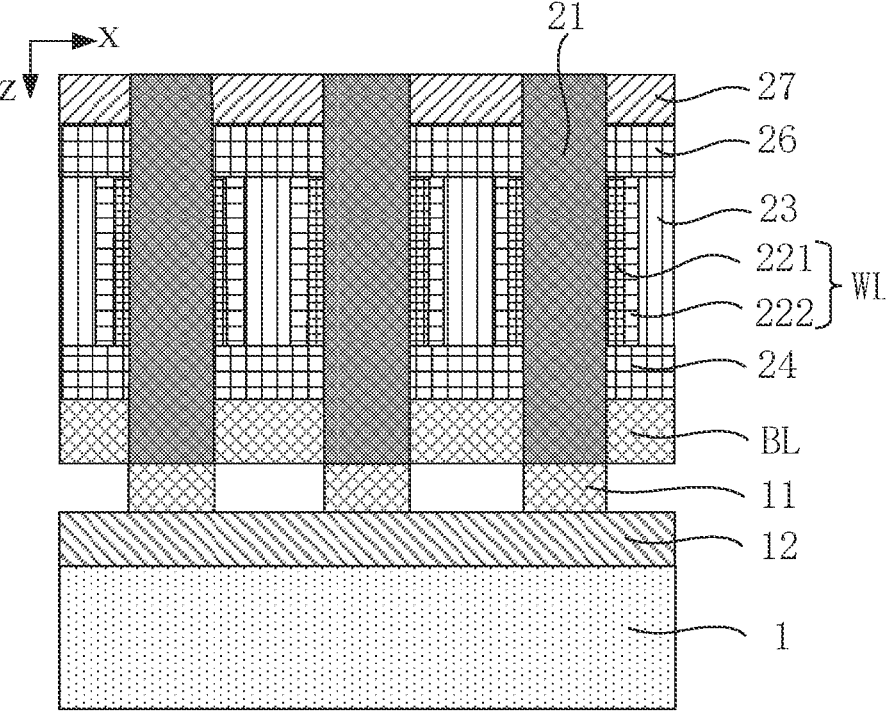
FIG. 19 is a schematic structural diagram of a structure obtained after forming a third dielectric layer and a fourth dielectric layer according to an embodiment.

Referring to FIG. 19, after Step S450 is performed to form the word line WL, and before Step S500 is performed to form the storage capacitor C on the side of the active pillar 21 facing away from the drive pad 11, the method further includes: forming a third dielectric layer 26, the third dielectric layer 26 covering the word line WL and a portion of the side wall of the active pillar 21; forming a fourth dielectric layer 27, the fourth dielectric layer 27 covering the third dielectric layer 26 and a residual side wall of the active pillar 21, and a surface of the fourth dielectric layers 27 facing away from the first substrate 1 being flush with a surface of the active pillar 21 facing away from the first substrate 1.

For example, the first dielectric layer 26 may be made of a nitride such as silicon nitride.

For example, the fourth dielectric layer 27 may be made of an oxide such as silicon oxide.

Figure 20:
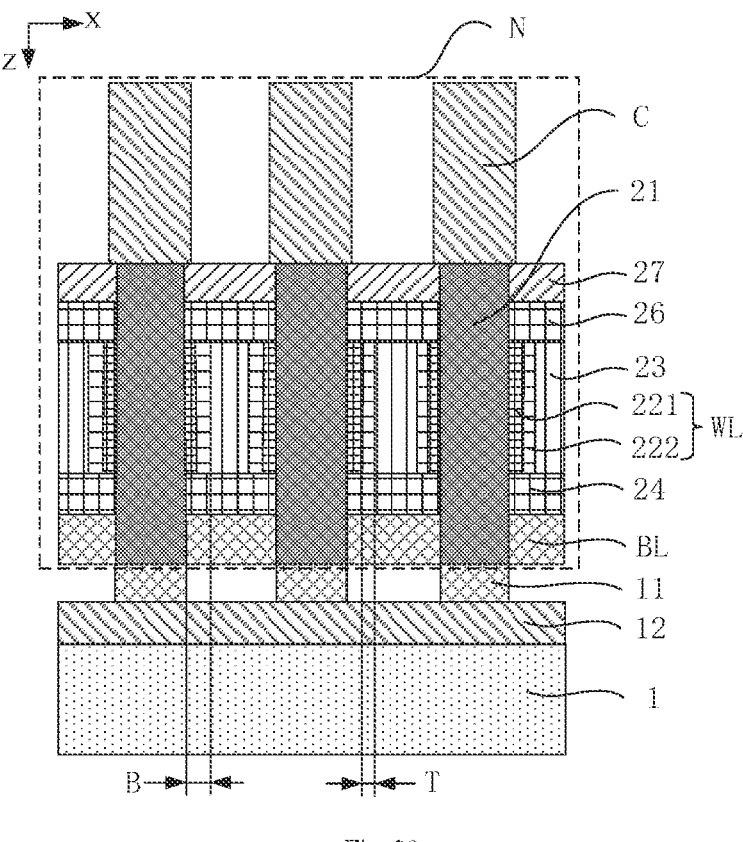
FIG. 20 is a schematic structural diagram of a semiconductor structure according to an embodiment.

In Step S500, referring to FIG. 20, a storage capacitor C is formed on a side of the active pillar 21 facing away from the drive pad 11.

In the embodiments of the present disclosure, a structure of the storage capacitor C is not limited. For example, the storage capacitor C may be a column-shaped capacitor or a cup-shaped capacitor or other capacitors that can be stacked in a direction perpendicular to the first substrate 1.

For example, before the storage capacitor C is formed, the surfaces of the active pillar 21 and the fourth dielectric layer 27 facing away from the first substrate 1 may be polished to ensure that the storage capacitor C may have a good contact interface with the active pillar 21, to ensure the electrical properties of the semiconductor structure. That is, the storage capacitor C may be directly formed on the surface of the active pillar 21 to implement the connection between the storage capacitor C and the active pillar 21.

In addition, in some embodiments, a storage node contact structure may also be provided between the active pillar 21 and the storage capacitor C.

In another aspect, some embodiments of the present disclosure provide a semiconductor structure, which is obtained by means of the method for fabricating the semiconductor structure as described in some of the above embodiments.

Figure 21:
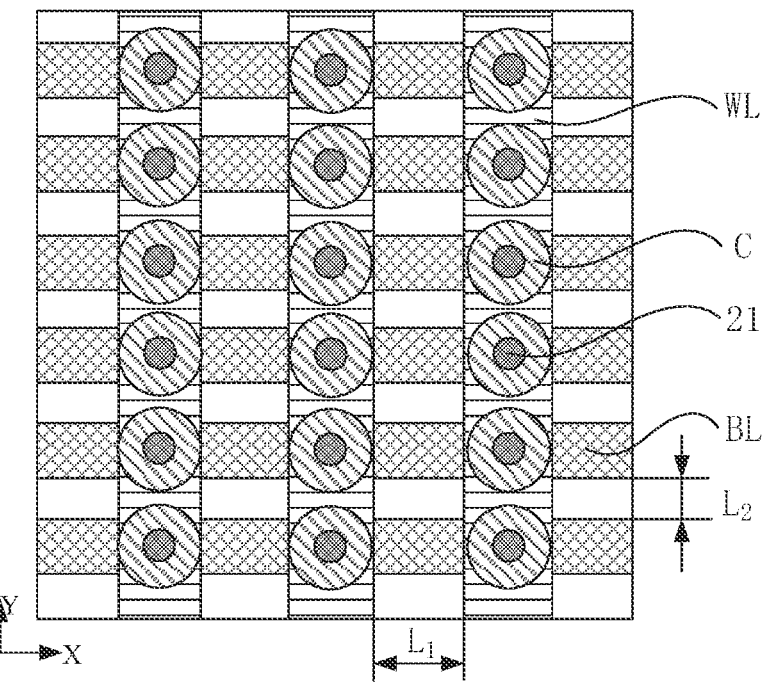
FIG. 21 is a schematic top view of a semiconductor structure according to an embodiment of the present disclosure.

Referring to FIG. 20 and FIG. 21, the semiconductor structure includes a first substrate 1 and a memory device N. The first substrate 1 is provided with a drive pad 11, and the memory device N is bonded to a side of the drive pad 11 facing away from the first substrate 1. The memory device N includes a plurality of active pillars 21, and a bit line BL and a storage capacitor C respectively positioned at two ends of each of the plurality of active pillars 21. A surface of the bit line BL facing away from the first substrate 1 is connected to ends of the plurality of active pillars 21 close to the first substrate 1, the storage capacitor C is connected to ends of the plurality of active pillars 21 facing away from the bit line BL, and a surface of the bit line BL close to the first substrate 1 is bonded to the drive pad 11.

Here, with reference to the method in some of the above embodiments, it may be known that the plurality of active pillars 21 may be formed on the second substrate 2 first. Next, after the bit line BL is bonded to the drive pad 11, the second substrate 2 is thinned to remove other portions of the second substrate 2 other than the plurality of active pillars 21, such that it is also convenient to perform the etching process for the word line WL and the fabrication process for the storage capacitor C from a side of the second substrate 2 facing away from the first substrate 1.

In some embodiments, with continued reference to FIG. 20 and FIG. 21, the memory device N further includes a word line WL provided on the side walls of the plurality of active pillars 21. The bit line BL extends in a first direction (e.g., an X direction), and the word line WL extends in a second direction (e.g., a Y direction), where the first direction intersects with, for example, is perpendicular to, the second direction. In addition, the word line WL is formed after the bit line BL is bonded to the drive pad 11 and before the storage capacitor C is formed.

In some embodiments, as shown in FIG. 20, the memory device N further includes an isolation portion 23 positioned between adjacent two of the word lines WL.

Here, reference may be made to some of the above embodiments for the fabrication processes for the word line WL and the isolation portion 23, and details are not described herein again.

In addition, for example, with continued reference to FIG. 20, the memory device N further includes a first dielectric layer 24 provided between the bit line BL and the word line WL to isolate the bit line BL from the word line WL. The first dielectric layer 24 is, for example, a nitride layer such as a silicon nitride layer.

For example, the memory device N further includes a second dielectric layer (not shown in the figure) provided between adjacent two of the bit lines BL to isolate adjacent two of the bit lines BL. The second dielectric layer is, for example, an oxide layer such as a silicon oxide layer.

For example, with continued reference to FIG. 20, the memory device N further includes a third dielectric layer 26 and a fourth dielectric layer 27 stacked on a side of the word line WL facing away from the first substrate 1. The third dielectric layer 26 is, for example, a nitride layer such as a silicon nitride layer. The fourth dielectric layer 27 is, for example, an oxide layer such as a silicon oxide layer.

In some embodiments, the surface of the fourth dielectric layer 27 facing away from the first substrate 1 is flush with the surfaces of the plurality of active pillars 21 facing away from the first substrate 1, and can be formed by means of a polishing process to ensure that a good contact interface can be provided between the storage capacitor C formed subsequently and the plurality of active pillars 21.

In some embodiments, with continued reference to FIG. 20 and FIG. 21, there are a plurality of active pillars 21, and the plurality of active pillars 21 are arranged in an array.

Here, the plurality of active pillars 21 are arranged in an array, and are arranged in rows in the first direction (e.g., the X direction) and arranged in columns in the second direction (e.g., the Y direction). In some embodiments, the interval between the plurality of active pillars 21 arranged in rows in the first direction (e.g., the X direction) may be different from the interval between the plurality of active pillars 21 arranged in columns in the second direction (e.g., the Y direction).

For example, the size of the distance between adjacent two of the plurality of active pillars 21 in the first direction (e.g., the X direction) is a first size $L_1$, and the size of the distance between adjacent two of the plurality of active pillars 21 in the second direction (e.g., the Y direction) is a second size L2, where the first size $L_1$ is three times greater than the second size L2, and the second size L2 is less than or equal to two or three times the thickness B of the word line WL in the first direction.

Furthermore, in some embodiments, the word line WL includes a gate dielectric layer 221 and a conductive layer 222 provided on the side walls of the plurality of active pillars 21 in a direction distant from the plurality of active pillars 21, where the second size L2 is less than or equal to three times the thickness T of the conductive layer 222 in the first direction (e.g., the X direction).

It is to be understood that the word line WL extends in the second direction (e.g., the Y direction). In the above example where the first size $L_1$ is three times greater than the second size L2, and the second size L2 is less than or equal to two or three times the thickness B of the word line WL in the first direction (e.g., the X direction), or the second size L2 is less than or equal to three times the thickness T of the conductive layer 222 in the first direction (e.g., the X direction), when the conductive material layer is deposited between adjacent two of the plurality of active pillars 21 in the second direction (e.g., the Y direction), the conductive material layer positioned on the side walls of adjacent two of the plurality of active pillars 21 can be directly connected, to simplify the formation processes for the word line WL.

In the description of this specification, reference to the description of the terms "some embodiments", "other embodiments", "ideal embodiments", etc. means that a particular feature, structure, material or feature described in connection with the embodiments or examples is included in at least one embodiment or example of the present disclosure. The schematic representation of the above terms throughout this specification is not necessarily referring to the same embodiment or example.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A method for fabricating a semiconductor structure, comprising:

providing a first substrate, and forming a drive pad on the first substrate;

providing a second substrate, and forming a plurality of active pillars and a bit line in sequence on a side of the second substrate, wherein a side of the bit line is connected to the plurality of active pillars, and a surface of the bit line facing away from the plurality of active pillars is exposed on a surface of the second substrate;

bonding the bit line to the drive pad correspondingly;

thinning the second substrate from a side of the second substrate facing away from the first substrate until the plurality of active pillars are exposed; and forming a storage capacitor on sides of the plurality of active pillars facing away from the drive pad, the storage capacitor being connected to the plurality of active pillars;

wherein:

after the plurality of active pillars are formed and before the bit line is formed, the method further comprises: forming a word line material layer on side walls of the plurality of active pillars; and after the second substrate is thinned until the plurality of active pillars are exposed, and before the storage capacitor is formed on the sides of the plurality of active pillars facing away from the drive pad, the method further comprises: etching the word line material layer to form a word line;

wherein the bit line extends in a first direction, the word line extends in a second direction, and the first direction intersects with the second direction.

2. The method for fabricating the semiconductor structure according to claim 1, wherein the forming the plurality of active pillars on a side of the second substrate comprises: patterning the second substrate to form a plurality of active pillars arranged in an array;

wherein a distance between adjacent two of the plurality of active pillars in the first direction is a first size, and a distance between adjacent two of the plurality of active pillars in the second direction is a second size, the first size being three times greater than the second size, and the second size being less than or equal to two or three times a thickness of the word line in the first direction.

3. The method for fabricating the semiconductor structure according to claim 1, wherein before the word line material layer is formed on the side walls of the plurality of active pillars, the method further comprises: forming a sacrificial layer on a surface of the second substrate, the sacrificial layer covering a portion of the side walls of all the plurality of active pillars and the surface of the second substrate between adjacent two of the plurality of active pillars;

the forming a word line material layer on the side walls of the plurality of active pillars comprises: forming a gate dielectric material layer and a conductive material layer in sequence on exposed surfaces of the plurality of active pillars, wherein the gate dielectric material layer covers the exposed side walls of the plurality of active pillars, and the conductive material layer covers the gate dielectric material layer and the sacrificial layer, the gate dielectric material layer and the conductive material layer jointly constituting the word line material layer; and after the word line material layer is formed on the side walls of the plurality of active pillars, the method further comprises: forming an isolation material layer, the isolation material layer covering the conductive material layer and being filled into a groove between adjacent two of the plurality of active pillars.

4. The method for fabricating the semiconductor structure according to claim 3, wherein before the bit line is formed, the method further comprises:

etching the isolation material layer and the word line material layer in a direction perpendicular to the second substrate, to form an isolation structure and a word line intermediate structure, and expose a portion of the side walls of the plurality of active pillars;

forming a first dielectric layer, the first dielectric layer covering the isolation structure, the word line intermediate structure, and a portion of the side walls of the plurality of active pillars; and forming a second dielectric layer extending in the first direction between adjacent two of the plurality of active pillars arranged in the second direction, the second dielectric layer covering a portion of the first dielectric layer and a portion of the side walls of the plurality of active pillars.

5. The method for fabricating the semiconductor structure according to claim 4, wherein the forming the bit line comprises:

forming a metal layer on a surface of the groove between adjacent two of the plurality of active pillars arranged in the first direction, the metal layer covering the plurality of active pillars and a side wall of the second dielectric layer exposed into the groove; and performing heat treatment on the metal layer and the plurality of active pillars covered by the metal layer, to form the bit line connected to the plurality of active pillars.

6. The method for fabricating the semiconductor structure according to claim 5, wherein the thinning the second substrate from a side of the second substrate facing away from the first substrate until the plurality of active pillars are exposed further comprises: exposing a surface of the sacrificial layer facing away from the word line intermediate structure; and the method further comprises: removing the sacrificial layer and a portion of the word line intermediate structure to form the word line and an isolation portion positioned between adjacent two of the word lines.

7. The method for fabricating the semiconductor structure according to claim 6, wherein the removing of the portion of the word line intermediate structure comprises:

etching the word line intermediate structure in a direction perpendicular to the first substrate, to separate the conductive material layer between adjacent two of the plurality of active pillars in the first direction, and enable the conductive material layer connected in the second direction to constitute the word line.

8. The method for fabricating the semiconductor structure according to claim 1, wherein after the word line is formed, and before the storage capacitor is formed on the sides of the plurality of active pillars facing away from the drive pad, the method further comprises:

forming a third dielectric layer, the third dielectric layer covering the word line and a portion of the side walls of the plurality of active pillars; and forming a fourth dielectric layer, the fourth dielectric layer covering the third dielectric layer and residual side walls of the plurality of active pillars, and a surface of the fourth dielectric layer facing away from the first substrate being flush with a surface of one of the plurality of active pillars facing away from the first substrate.

9. The method for fabricating the semiconductor structure according to claim 8, wherein the forming the storage capacitor on the sides of the plurality of active pillars facing away from the drive pad further comprises:

polishing the plurality of active pillars and the surface of the fourth dielectric layer facing away from the first substrate; and forming the storage capacitor on the surface of one of the plurality of active pillars facing away from the first substrate.

\* \* \* \* \*